United States Patent
Nodine

(10) Patent No.: US 7,839,657 B2
(45) Date of Patent: Nov. 23, 2010

(54) POSITION ADJUSTABLE PRINTED CIRCUIT BOARD

(75) Inventor: Thomas H. Nodine, Newport News, VA (US)

(73) Assignee: Continental Automotive Systems US, Inc., Auburn Hills, MI (US)

( * ) Notice: Subject to any disclaimer, the term of this patent is extended or adjusted under 35 U.S.C. 154(b) by 698 days.

(21) Appl. No.: 11/414,429

(22) Filed: Apr. 28, 2006

(65) Prior Publication Data

US 2007/0253172 A1    Nov. 1, 2007

(51) Int. Cl.
    *H05K 1/14*    (2006.01)
(52) U.S. Cl. .................... 361/803; 361/776; 361/796
(58) Field of Classification Search ............. 361/730, 361/736, 752, 776, 796, 803
    See application file for complete search history.

(56) References Cited

U.S. PATENT DOCUMENTS

| | | | | |
|---|---|---|---|---|
| 4,335,272 A | * | 6/1982 | Pittenger | 174/254 |
| 4,547,795 A | * | 10/1985 | Wulff | 257/665 |
| 5,325,267 A | * | 6/1994 | Ewing | 361/760 |
| 5,548,091 A | * | 8/1996 | DiStefano et al. | 174/260 |
| 5,629,239 A | * | 5/1997 | DiStefano et al. | 216/14 |
| 5,821,609 A | * | 10/1998 | DiStefano et al. | 257/669 |
| 6,075,708 A | * | 6/2000 | Nakamura | 361/752 |
| 6,181,033 B1 | * | 1/2001 | Wright | 310/67 R |
| 6,191,506 B1 | * | 2/2001 | Wright | 29/598 |
| 6,201,185 B1 | * | 3/2001 | Ishida et al. | 174/546 |
| 6,274,822 B1 | * | 8/2001 | Light et al. | 174/260 |
| 6,594,152 B2 | * | 7/2003 | Dent | 361/785 |

* cited by examiner

*Primary Examiner*—Dameon E Levi

(57) ABSTRACT

A circuit board assembly includes a mother board and a daughter board. The daughter board is defined by a plurality of frangible connections to the mother board and is disposed on a common plane with the mother board. After all the electronic devices are installed to the mother board and the daughter board on a common plane the frangible connections are broken to allow the daughter board to be moved to a desired position relative to the mother board. The electrical conductors that connect the daughter board to the mother board are semi-rigid to provide movement while maintaining a desired position of the daughter board relative to the mother board.

12 Claims, 4 Drawing Sheets

POSITION ADJUSTABLE PRINTED CIRCUIT BOARD

BACKGROUND OF THE INVENTION

This invention generally relates to a circuit board assembly. More particularly, this invention relates to a circuit board including a daughter board and a mother board.

A circuit board provides for the assembly and mounting of many electronic devices such as for example a light emitting diode display. In some applications, a smaller circuit is supported on a smaller circuit board that is mounted and connected electrically to a main mother board. The smaller circuit, commonly known as a daughter board, provides for positioning part of the circuit at a different orientation relative to the mother board. Electrical connections between the mother board and the daughter board are typically provided by an electrical connector attached to each of the mother board and the daughter board. The daughter board is then mounted to a mechanical support to physically orientate and hold it in place relative to the mother board.

Disadvantageously, electrical connectors require assembly and increase both material and assembly costs. Further, additional mechanical structure is required of the housing to support the daughter board independent of the mother board at additional cost.

Accordingly, it is desirable to design and develop a mother daughter circuit board assembly with reduced electrical connections that physically supports the desired relative position between the mother board and the daughter board.

SUMMARY OF THE INVENTION

An example circuit board according to this invention includes a daughter board formed within the mother board and defined by a plurality of openings. The openings are interspersed between a plurality of support legs. The daughter board includes a plurality of leads that extend across the openings to the mother board. The support legs are removed once all components are installed to the mother board and the daughter board to allow the daughter board to be positioned relative to the mother board.

The leads are formed of a material with such rigidity that they hold and support the daughter board in a relative position to the mother board. The method and assembly according to this invention provides for the installation of all circuit materials and electronic devices to the mother board and daughter board on a common plane. This simplifies assembly and eliminates the need for several different connectors. Once all the desired electronic devices are installed to the mother board and the daughter board, the daughter board is released from the mother board by removing the support legs. Once the support legs are removed the leads are of such rigidity that they provide support and hold the daughter board in a desired position relative to the mother board.

The circuit board is then mounted within a housing. The housing includes posts that hold and maintain the position of the daughter board relative to the mother board. The posts of the housing do not include features to secure the daughter board only features that maintain a desired relative angle or position to the mother board.

Accordingly, the example circuit board and method of assembling the circuit board provide for the elimination of multiple connectors and other devices required to provide a physical and electrical connection between a mother board and a daughter board.

These and other features of the present invention can be best understood from the following specification and drawings, the following of which is a brief description.

DETAILED DESCRIPTION OF THE PREFERRED EMBODIMENT

Figure 1:
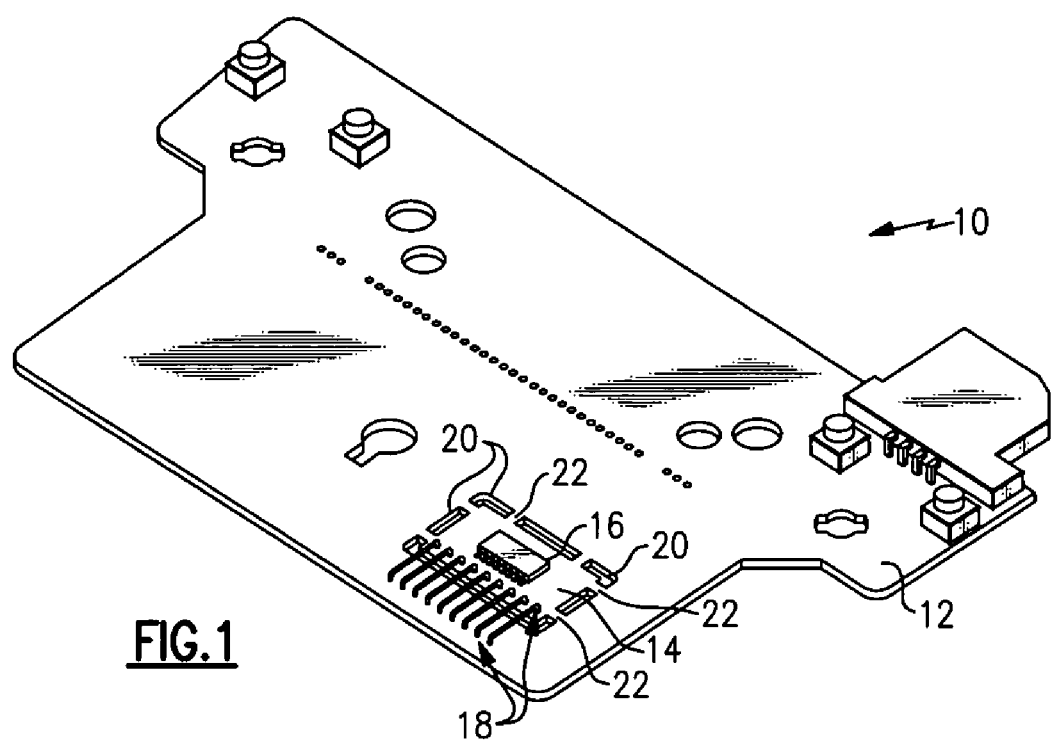
FIG. 1 is a perspective view of an example circuit board assembly according to this invention.
Figure 2:
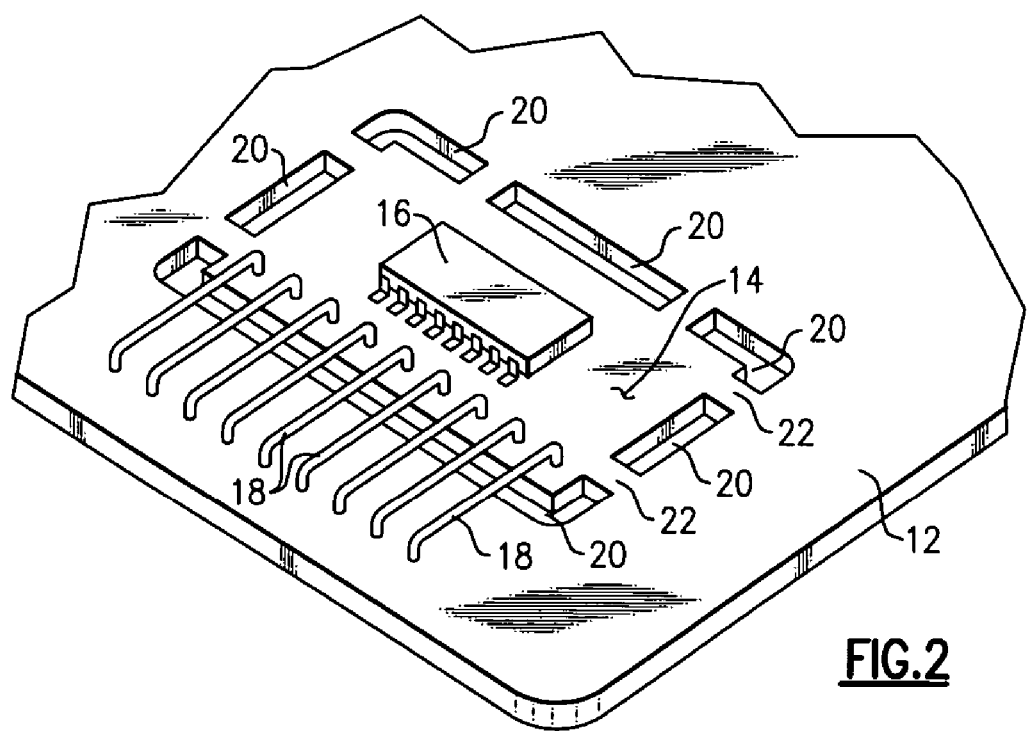
FIG. 2 is an enlarged view of a portion of an example daughter board connection to a mother board according to this invention.

Referring to FIGS. 1 and 2, a circuit board assembly 10 includes a mother board 12 and a daughter board 14. The daughter board 14 is provided for support of a microcontroller 16. Although a microcontroller 16 is included and illustrated by way of example, other electronic components that are desired to be orientated at a position different than the mother board would also benefit from the disclosures of this invention.

The daughter board 14 is surrounded partially by openings 20. The openings 20 are interspersed by frangible support legs 22. The support legs 22 maintain the position of the daughter board 14 and provide for a connection of the daughter board 14 to the mother board 12 during assembly. The supports legs 22 hold the daughter board 14 in a common plane with the mother board 12 during assembly, such that all assembly can be conducted on a single plane.

A plurality of semi-rigid electrical leads 18 extend from the mother board across an opening 20 to the daughter board 14. These leads 18 provide electrical communication between devices on the mother board 12 and the microcontroller 16 mounted on the daughter board 14. The leads 18 are of a material that provides the desired electrical conductivity while also providing a desired rigidity. The rigidity of the leads 18 provide for the support of the daughter board 14 in a desired position relative to the mother board 12. The microcontroller 16 and leads 18 are assembled to the circuit board assembly 10 while the daughter board 14 is still an integral part of the mother board 12. These leads 18 are provided in the desired number and position as are required to provide the desired electrical communication between the devices that are mounted on the daughter board 14 and other electrical devices mounted on the mother board 12.

Figure 3:
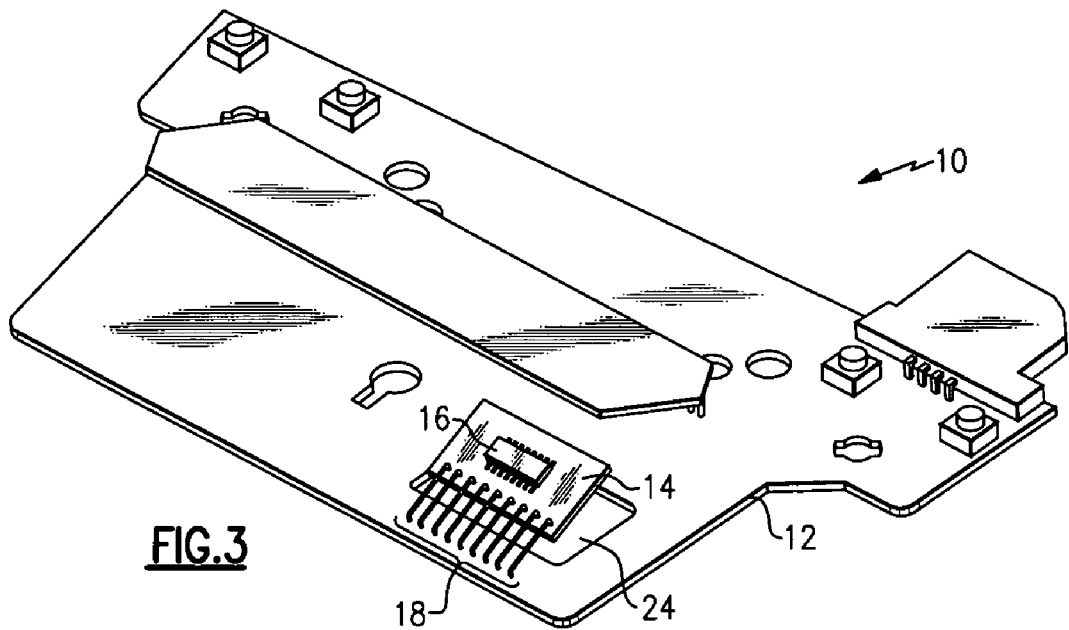
FIG. 3 is a perspective view of a daughter board released from a mother board according to this invention.

Referring to FIG. 3, once each of the desired electrical devices are mounted to both the daughter board 14 and the mother board 12 and other assembly operations are concluded for assembly onto the mother board 12 the daughter board 14 is released. The daughter board 14 is released by breaking or removing the plurality of legs 22 disposed about the daughter board 14.

Once the frangible support legs 22 are removed, the daughter board 14 is free of the mother board 12 and can be moved to a desired position relative to the mother board 12. The position of the daughter board 14 relative to the mother board 12 is maintained by the leads 18. The leads 18 are of such rigidity that they allow movement of the daughter board 14 while also providing support. Accordingly, the daughter board 14 can be moved relative to the mother board 12 to a desired position where the rigidity of the leads 18 maintain the position of the daughter board 14.

Figure 4:
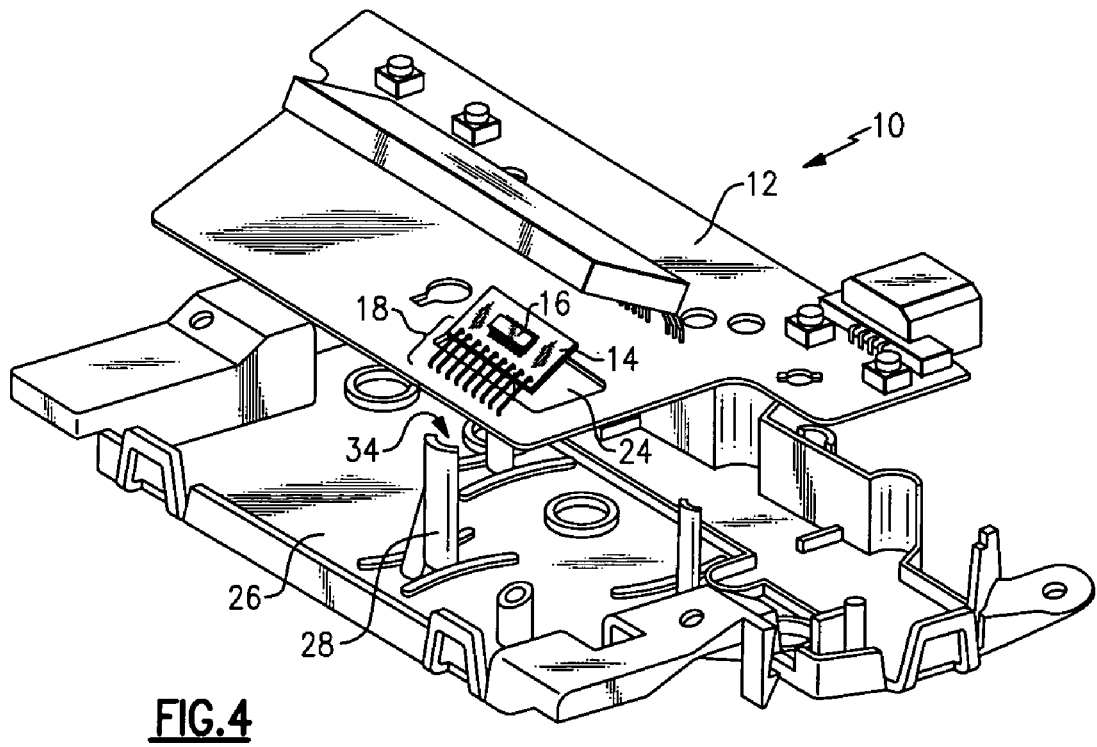
FIG. 4 is a perspective of the example mother board and daughter board being assembled into a first portion of a housing.

Referring to FIG. 4, as appreciated the position of the daughter board 14 is desired to be maintained in a specific orientation relative to the mother board 12. Although, the rigidity of the leads 18 are enough to maintain a position and hold the position of the daughter board 14 relative to the circuit board 12, other structures can be utilized to hold and maintain the position of the daughter board 14.

In the illustrative example the circuit assembly 10 is installed into a housing 26. The housing 26 is a lower portion of the housing and includes a support post 28. The support post 28 is merely a post that extends upward through an opening 24 formed upon the removal of the support legs 22. The support post 28 does not include a fastening or connecting features that are attached to the daughter board 14, but instead only includes a mounting surface 34 that abuts the daughter board 14 to maintain the desired orientation to the mother board 12.

It is the leads 18 that secure the daughter board 14 in the desired position. The support post 28 is not fastened to the daughter board 14, and instead only maintains the desired position. The daughter board 14 maintains a position to which it is moved. In other words, the leads 18 are of such rigidity to allow movement upon the application of force, and hold the daughter board 14 in place once the force is removed.

Movement caused by jostling or other environmental movement of the entire circuit board assembly could cause some relative movement of the daughter board 14 relative to the mother board 12, thereby causing a movement of the daughter board 14 to jostle it and move it from the desired position relative to the mother board 12. Accordingly, the support post 28 prevents this while providing some support for the daughter board 14.

Figure 5:
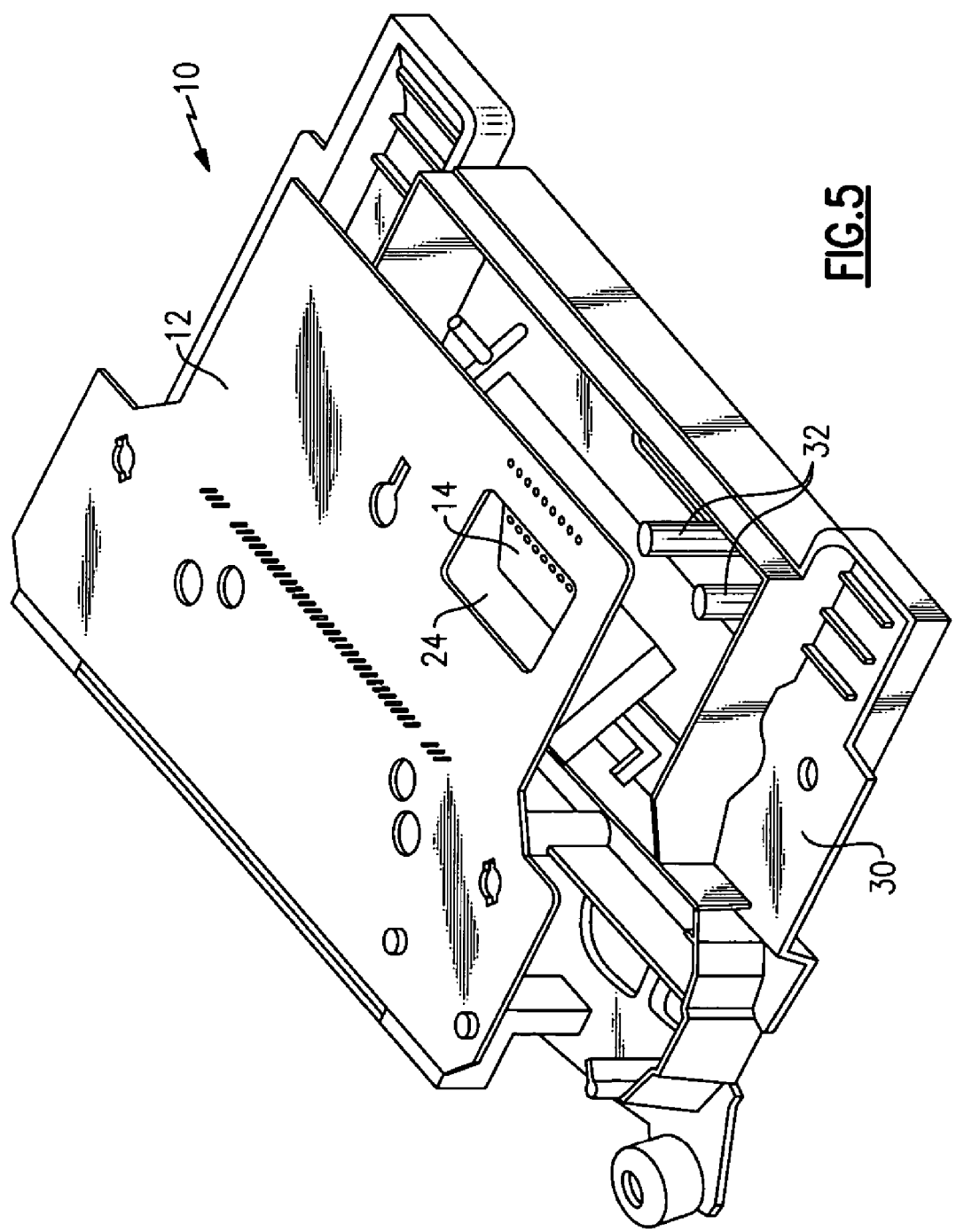
FIG. 5 is a perspective view of the example mother board according to this invention being assembled into an upper housing portion.

Referring to FIG. 5, a top portion of the housing 30 is illustrated and includes second support posts 32 that abut the top surface of the daughter board 14. The circuit board assembly 12 is installed between the lower housing 28 and the upper housing 30 to protect and mount the circuit board assembly 10 for installation as is required for a desired application. Further, both the upper housing 30 and the lower housing 28 include features that abut and correspond to the daughter board 14 to maintain a desired, relative orientation between the daughter board 14 and the mother board 12. Neither of the example support posts 32 or 28 includes fastening devices attached to the daughter board 14. The plurality of leads 18 are depended on to maintain the position and electrical connection between the daughter board 14 and the mother board 12.

Figure 6:
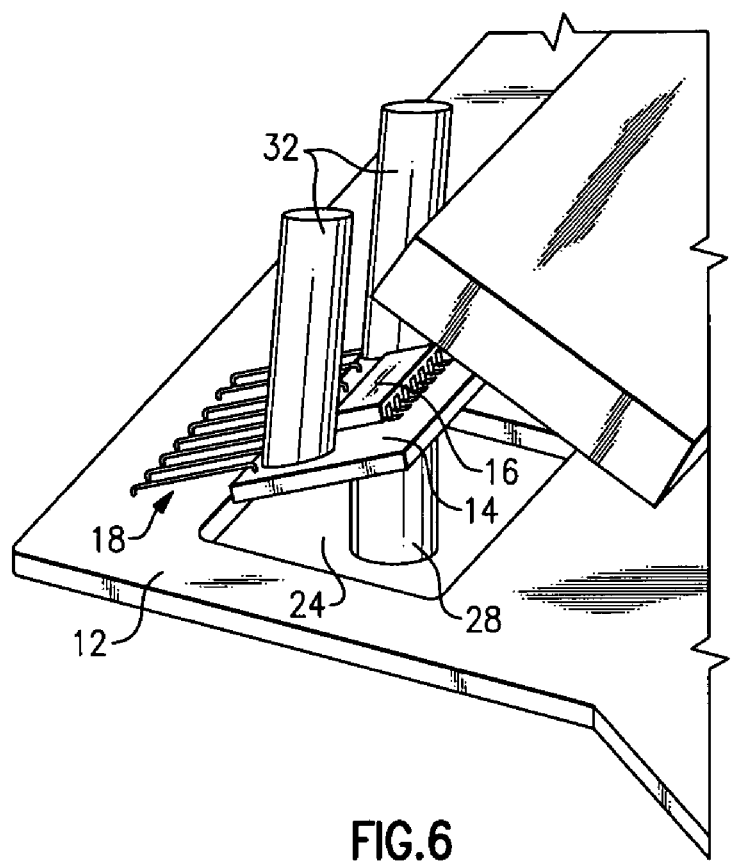
FIG. 6 is a perspective view illustrating the example daughter board supported by posts of the housing.
Figure 7:
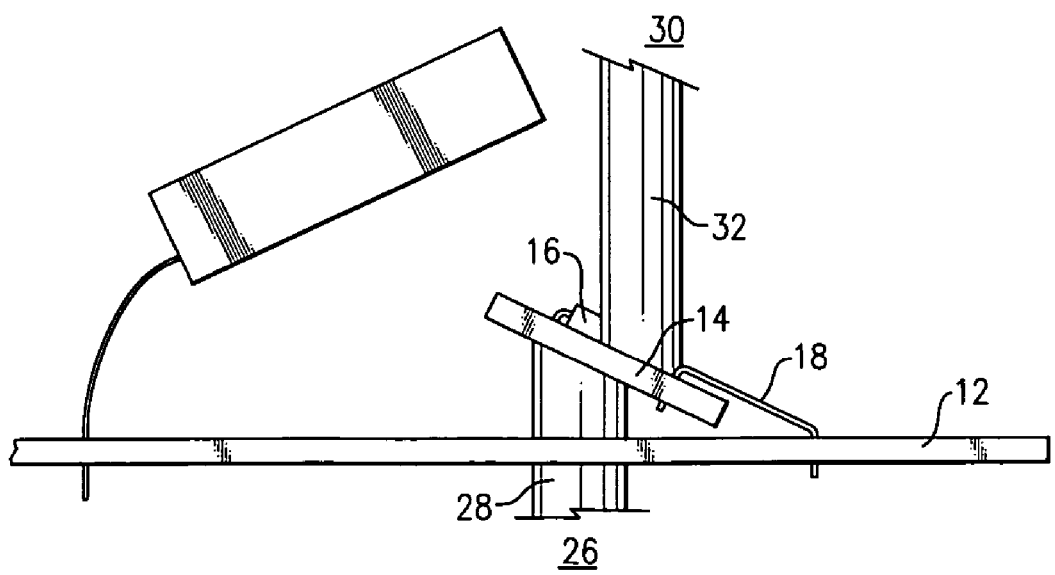
FIG. 7 is a cross-sectional view of the daughter board in a completed circuit board assembly mounted within the example housing.

Referring to FIGS. 6 and 7, the daughter board 14 is shown in a finally assembled position at an angle relative to the mother board 12. In the final assembled position, the top support posts 32 from the top housing 30 abut a top surface of the daughter board 14. The bottom support post 28 abuts a bottom surface of the daughter board 14, thereby trapping the daughter board 14 between the support posts 28 and 32. The example daughter board 14 is not secured or fastened to either of the posts 28 or 32. Instead the daughter board 14 is prevented from slipping out or otherwise deviating from the desired position by the rigidity of the leads 18. The leads 18 include a desired rigidity that maintains the orientation of the daughter board 14 and prevents slipping of the daughter board 14 away from the supports 28.

Accordingly, the method and assembly according to this invention provides a simplified method of mounting a daughter board 14 relative to a mother board 12 and holding that daughter board 14 in a desired position without the use of complicated connectors and additional connection devices.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A method of assembling a circuit board comprising the steps of:
   a) defining a daughter board within a mother board, wherein the daughter board is attached to the mother board through a frangible connection;
   b) electrically connecting the daughter board to the mother board through a plurality of electrical conductors;
   c) separating the daughter board from the mother board by breaking the frangible connection to the mother board; and
   d) positioning the daughter board in a desired orientation spaced apart from the mother board.

2. The method as recited in claim 1, wherein the electrical conductors comprise a bus wire having rigidity capable of supporting the daughter board in the desired orientation.

3. The method as recited in claim 1, wherein the step of defining the daughter board includes cutting a slot into the mother board partially surrounding the daughter board such that at least some of the mother board remains attached to the daughter board.

4. The method as recited in claim 3, wherein the separating step includes cutting away remaining portions of the mother board attached to the daughter board.

5. The method as recited in claim 1, wherein the mother board and the daughter board are disposed within a common plane until the separating step.

6. A method of assembling a circuit board comprising the steps of:
   defining a daughter board within a mother board, wherein the daughter board is attached to the mother board through a frangible connection;
   electrically connecting the daughter board to the mother board through a pluralityof electrical conductors;
   separating the daughter board from the mother board by breaking the frangible connection to the mother board; and
   positioning the daughter board in a desired orientation spaced apart from the mother board; and
   mounting the mother board within a lower housing, where the lower housing includes a support member for partially supporting the daughter board in an orientation different and separate from than the mother board.

7. The method as recited in claim 6, including assembling an upper housing to the lower housing, where the upper housing includes a support feature abutting the daughter board for maintaining the daughter board in the orientation different than the mother board.

8. A circuit board assembly comprising:
a mother board; and
a daughter board defined by a frangible connection to the mother board; and
a plurality of electrical conductors electrically connecting the daughter board to the mother board, wherein the daughter board in supported in a desired position separate from and spaced apart from the mother board; and
a housing for holding the mother board and daughter board in a desired orientation such that the daughter board is separate and spaced apart from the mother board.

9. The assembly as recited in claim 8, wherein the housing includes an upper part and a lower part, wherein both the upper part and lower part include a post for abutting opposite sides of the daughter board for maintaining the desired orientation of the daughter board spaced apart from the mother board.

10. The method as recited in claim 1, wherein the daughter board is surrounded on four sides by the mother board.

11. The method as recited in claim 7, wherein one of the support member of the lower housing and the support features of the upper housing extends through an opening in the mother board.

12. The assembly as recited in claim 8, wherein the daughter board is surrounded on four sides by the mother board.

* * * * *